(12) United States Patent
    Bellos et al.

(10) Patent No.: US 10,724,730 B2
(45) Date of Patent: Jul. 28, 2020

(54) UTILITY, WORK OR INSPECTION LIGHT

(71) Applicants: David P. Bellos, Cincinnati, OH (US); Michael B. Bellos, Cincinnati, OH (US)

(72) Inventors: David P. Bellos, Cincinnati, OH (US); Michael B. Bellos, Cincinnati, OH (US)

(*) Notice: Subject to any disclaimer, the term of this patent is extended or adjusted under 35 U.S.C. 154(b) by 0 days.

(21) Appl. No.: 16/104,367

(22) Filed: Aug. 17, 2018

(65) Prior Publication Data
    US 2020/0056774 A1    Feb. 20, 2020

(51) Int. Cl.
| | |
|---|---|
| *F21V 31/00* | (2006.01) |
| *F21V 23/00* | (2015.01) |
| *F21S 4/22* | (2016.01) |
| *F21V 21/08* | (2006.01) |
| *F21V 21/096* | (2006.01) |
| *F21V 23/02* | (2006.01) |
| *F21V 23/06* | (2006.01) |
| *F21V 21/40* | (2006.01) |
| *F21S 9/02* | (2006.01) |
| *F21W 131/402* | (2006.01) |
| *F21Y 115/10* | (2016.01) |
| *H05K 1/18* | (2006.01) |
| *F21Y 113/13* | (2016.01) |
| *F21Y 103/10* | (2016.01) |

(52) U.S. Cl.
    CPC .............. *F21V 31/005* (2013.01); *F21S 4/22* (2016.01); *F21S 9/02* (2013.01); *F21V 21/08* (2013.01); *F21V 21/096* (2013.01); *F21V 21/40* (2013.01); *F21V 23/003* (2013.01); *F21V 23/02* (2013.01); *F21V 23/06* (2013.01); *F21W 2131/402* (2013.01); *F21Y 2103/10* (2016.08); *F21Y 2113/13* (2016.08); *F21Y 2115/10* (2016.08); *H05K 1/189* (2013.01); *H05K 2201/10106* (2013.01)

(58) Field of Classification Search
    CPC ................................ F21V 31/005; F21S 4/22
    See application file for complete search history.

(56) References Cited

U.S. PATENT DOCUMENTS

| | | | |
|---|---|---|---|
| 6,860,007 B1 | 3/2005 | Liu et al. | |
| 7,234,833 B2 | 6/2007 | Hatherill et al. | |
| 7,325,944 B2 | 2/2008 | Kovacik et al. | |
| 9,625,106 B2 | 4/2017 | Kovacik et al. | |
| 9,695,991 B2 | 7/2017 | Camarota | |
| 9,746,143 B2 | 8/2017 | Osburn | |
| 2011/0109235 A1* | 5/2011 | Link | F21V 23/04 315/191 |
| 2012/0002417 A1* | 1/2012 | Li | F21V 17/007 362/249.02 |
| 2016/0258607 A1* | 9/2016 | Carton | F21V 21/32 |
| 2016/0356439 A1* | 12/2016 | Inskeep | H02J 7/0052 |

* cited by examiner

*Primary Examiner* — Anne M Hines
(74) *Attorney, Agent, or Firm* — Andrew C. Hess

(57) ABSTRACT

Disclosed is a lighting device with a flexible LED light that may be used as a utility light, work light, or inspection light to illuminate task or work areas. The lighting device is moisture resistant and/or chemical resistant. The flexible LED light is resistant to failure caused by bending and twisting.

10 Claims, 4 Drawing Sheets

UTILITY, WORK OR INSPECTION LIGHT

CROSS-REFERENCE TO RELATED APPLICATIONS

Figure 1:
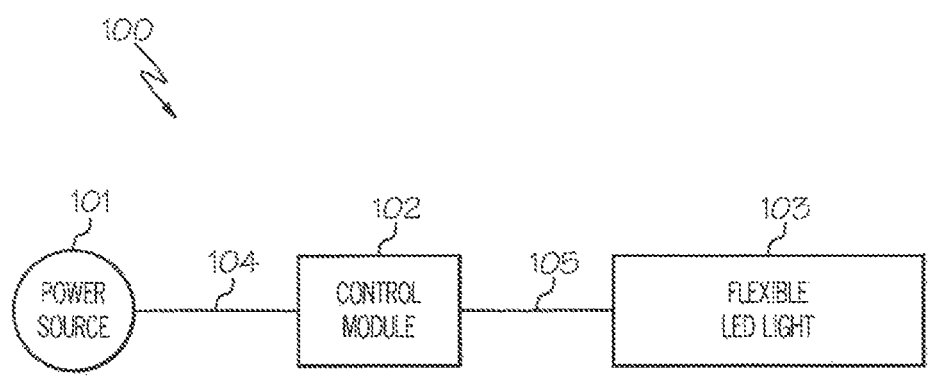

Not Applicable.

STATEMENT REGARDING FEDERALLY SPONSORED RESEARCH OR DEVELOPMENT

Not Applicable.

THE NAMES OF THE PARTIES TO A JOINT RESEARCH AGREEMENT

Not Applicable.

INCORPORATION-BY-REFERENCE OF MATERIAL SUBMITTED ON A COMPACT DISC OR AS A TEXT FILE VIA THE OFFICE ELECTRONIC FILING SYSTEM

Not Applicable.

STATEMENT REGARDING PRIOR DISCLOSURES BY THE INVENTOR OR A JOINT INVENTOR

Non-public disclosure by the joint inventors occurred during development and experimental testing.

BACKGROUND OF THE INVENTION

Field of the Invention

The present invention relates to lighting devices; particularly utility lights, work lights, or inspection lights used to illuminate task or work areas.

Description of Related Art Including Information Disclosed Under 37 CFR 1.97 and 1.98

Utility, work or inspection lights are widely used in manufacturing, repair or construction. These lights can be handheld, hung, temporarily attached, or positioned to illuminate a work or task area.

Incandescent and fluorescent bulbs have been used as light sources for such lights. However, those light sources are prone to damage or breakage when the light is dropped, knocked down or falls onto a hard surface. Often there is a bulky protective casing, shield or covering to protect the light source from damage. Additionally these light sources are high temperature sources that can burn the operator or present a potential fire hazard in some uses. The protective casing, shield or covering can lessen the temperature hazard.

With the relatively recent advent of the light emitting diode (LED), the LED has been used as the light source for such lights. Such prior art lights are constructed as an array of LEDs on a ridged substrate contained in a protective casing, shield or covering. Generally an LED is better able to survive impact damage than incandescent or fluorescent bulbs. The lower LED operating temperature also lessens the potential temperature hazard.

U.S. Pat. Nos. 7,234,833 and 7,325,944 disclose prior art configurations of work and utility lights with the light source of a ridged fixed LED array. These lights have ridged protective covers over or encasing the LED array. U.S. Pat. Nos. 9,625,106 and 9,746,143 disclose prior art configurations of work and utility light conversion modules to convert the light source from an incandescent or fluorescent bulb to a light source of a ridged fixed LED array. These light conversion modules have ridged protective covers over or encasing the LED array. U.S. Pat. Nos. 6,860,007 and 9,695,991 disclose various prior art decorative LED rope light and LED linear light configurations that are not suitable for work, utility and inspection light applications. The disclosed configurations are for decorative lighting, under counter lighting or garden lighting applications.

As described further herein some features of some aspects of the invention will address some of the issues raised above. Other features and other aspects will address other issues with existing LED lights to provide alternatives or improvements thereto.

BRIEF SUMMARY OF THE INVENTION

Disclosed is a lighting device with a flexible LED light that may be used as a utility light, work light, or inspection light to illuminate task or work areas. It is designed to be flexible and durable in work areas that are difficult to light and that may be prone to moisture and chemical environments. The lighting device should meet the standard for an International Protection Marking of IP 41 or greater.

BRIEF DESCRIPTION OF THE SEVERAL VIEWS OF THE DRAWING (S)

Figure 2:
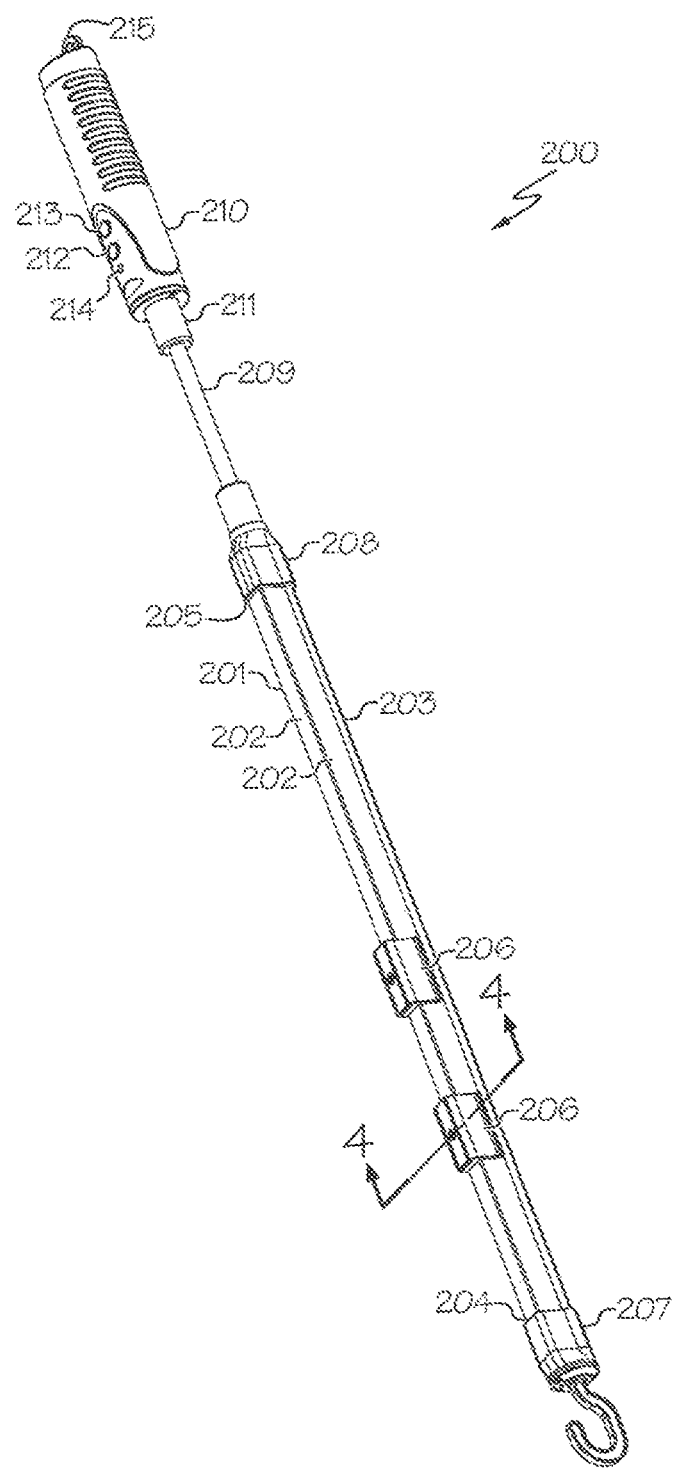
Figure 3:
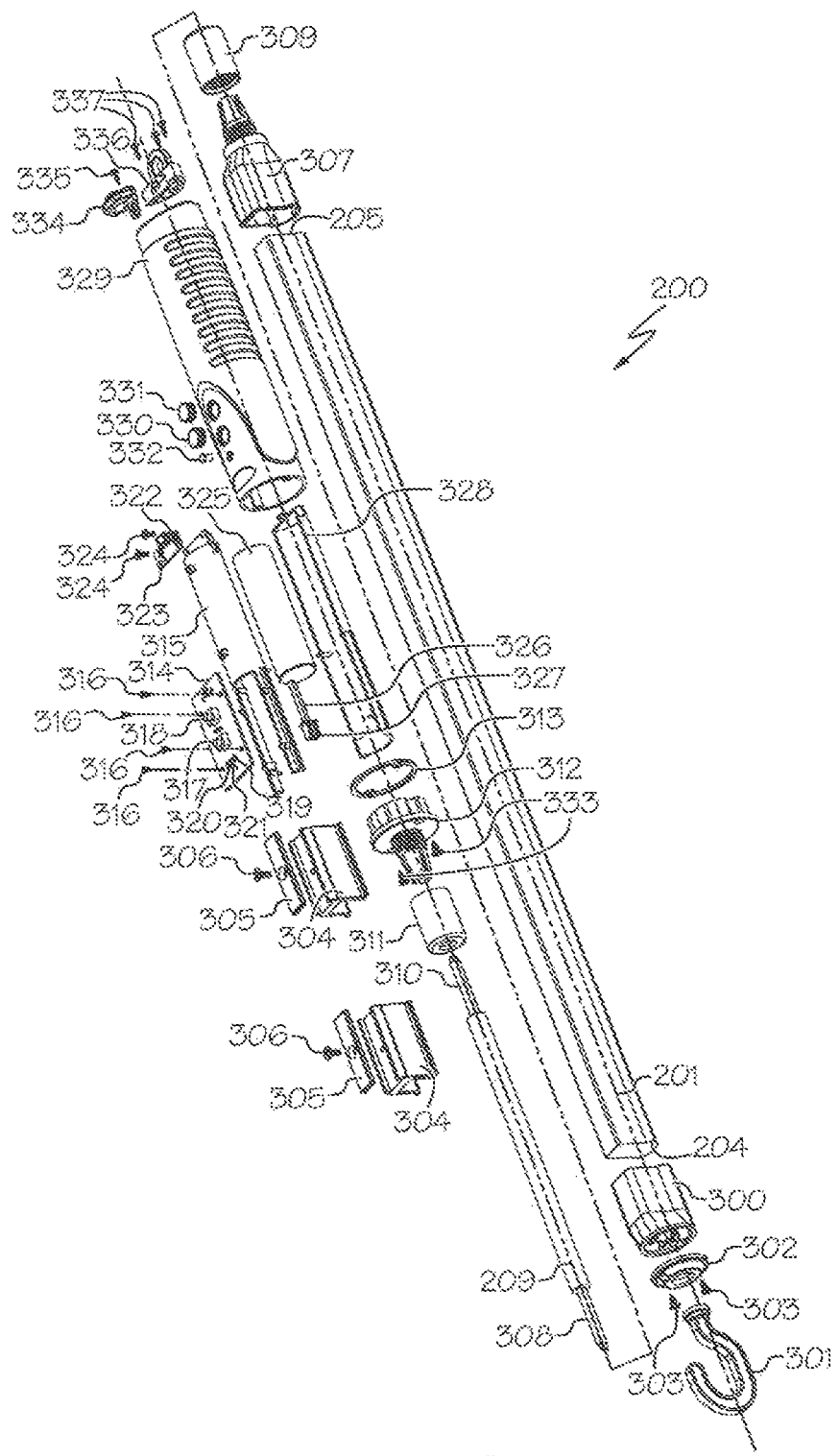
Figure 4:
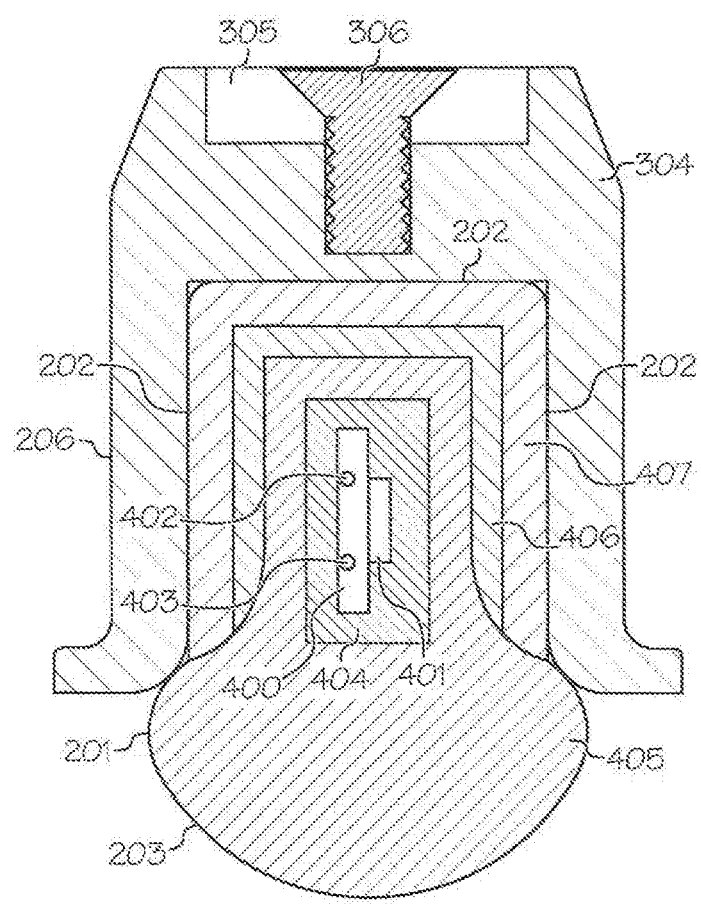

FIG. 1 is a general schematic of the invention.
FIG. 2 is a perspective view of an embodiment of the invention.
FIG. 3 is an exploded view of the embodiment of the invention illustrated in FIG. 2.
FIG. 4 is a cross section at line 4-4 of FIG. 2.

DETAILED DESCRIPTION OF THE INVENTION

The following detailed description and appended drawings describe and illustrate an exemplary embodiment of the invention. The description and drawings serve to enable one skilled in the art to make and use the invention, and are not intended to limit the scope of the invention in any manner.

Referencing FIG. 1, a lighting device 100 comprises a power source 101, a control module 102 that receives power from the power source 101, and a flexible LED light 103 that receives power from and is operated by the control module 102.

The input into power source 101 can be either alternating current (AC) or direct current (DC) and the output out of power source 101 is low voltage DC that is matched to the electrical characteristics of the flexible LED light 103. The AC or DC conversion to the matched low voltage DC can be accomplished by using an appropriate LED driver. An LED driver is an electrical device, typically a transformer, which regulates power to an LED device. LED drivers are commercially available or may be custom built circuits. The LED driver low voltage DC output is typically 5 volts, 12 volts or 24 volts DC. If the input into the LED driver is AC, it is typically 110-120 or 220-240 volts. If the input is DC, it typically comes from battery or array of batteries or an AC to DC transformer. The battery or array of batteries may be single use or rechargeable. In the event the battery or array of batteries is rechargeable, typically there are recharge/ discharge circuits that that regulate charging and/or discharge. These circuits may be separate from or integral with control module 102.

Control module 102 is connected to power source 101 through a conductive connection A 104 to receive the low voltage DC output from power source 101. The low voltage DC output of control module 102 is connected to flexible LED light 103 through a conductive connection B 105. Control module 102 controls and provides low voltage DC to flexible LED light 103. Utilizing various control devices or circuits the control module 102 functions may include any one or combinations of the following functionalities: light on/off, light blinking, light brightness, or light color. Additional control functions for flexible LED light 103 may be included in control module 102.

Flexible LED light 103 is an elongated lighting element that can be bent or twisted without damage to the element or discontinuity to the lighting function of the element. The Flexible LED light 103 is generally constructed of a linear flexible printed circuit board (FPCB) with various surface mounted devices (SMDs) mounted thereon to achieve the desired lighting functions of the Flexible LED light 103. The SMDs include at least one light emitting diode (LED) and other devices, such as resistors. There are many different types of LEDs and control mechanisms to choose from to obtain the desired lighting effect, such as brightness, color, and strobe. Several examples are as follows. In a single color, non-addressable lighting element every LED on the FPCB is a single white color, typically ranging from 2700K to 6500K color temperature, or any of several monochrome colors covering the range of the visible spectrum (generally from 400-700 nanometers in wavelength). In a multicolor, non addressable lighting element each LED in the FPCB is capable of displaying red, green, blue, or all three, to make white light, and are driven by three input power rails on the FPCB. All the LEDs display the same color at any one time, but the color can be manipulated by varying the voltage applied to each of the three power rails. In a red, green, blue (RGB) addressable lighting element LED has its own chip meaning it can be individually addressed to change color or strobe effect. The linear flexible printed circuit board (FPCB) and attached SMDs are incased in one or more layers of polymeric material to achieve one or more various desired properties of flexibility, impact resistance, protection from the environment, and lighting effects.

Referencing FIG. 2, a perspective view of an embodiment of the invention, utility light 200 includes flexible LED light strip 201. Flexible LED light strip 201 has non-illuminated surfaces 202, at least one illuminated surface 203, an end A 204, and an end B 205. Attached to the non-illuminated surfaces 202 is one or more magnet assembly 206. Magnet assembly 206 may be either in a fixed position on the length of flexible LED light strip 201 or adjustable to different positions on the length of flexible light strip 201. Attached to the end A 204 of flexible LED light strip 201 is flexible LED light strip end cap and hook assembly 207. Attached to end B 205 of flexible LED light strip 201 is flexible LED light strip coupler assembly 208 that couples the first end of electric cable 209 to end B 205 of flexible light strip 201. The second end of electric cable 209 is attached to handle 210 by handle coupler assembly 211. Located on the surface of handle 210 are an on/off button 212, function control button 213, and indicator light 214. Attached to the end of handle 210 is storage loop 215. An additional feature (not illustrated) that may be integral with, or added to, or associated with utility light 200 is a wired or wireless camera to observe or inspect a work area that may not be readily observable by a person using the utility work light. Such camera could be in the form of a fiber optic lens, fiber optic cable and viewing screen; or an internet enabled wireless camera and internet enabled observation device, such as a smart phone; or other such applicable remote viewing technologies. Another additional feature (not illustrated) that may be added to utility light 200 is a magnet attached to the head of the hook or replace the hook of flexible LED light strip end cap and hook assembly 207 for retrieving dropped or lost metallic objects.

FIG. 3 is an exploded parts diagram of the perspective view of the embodiment of utility light 200 that is illustrated in FIG. 2. End A 204 of Flexible LED light strip 201 is inserted into and attached to LED strip end cap 300. Hook 301 is attached to LED strip end cap 300 by insertion through hook attachment ring 302 which is secured by hook screws 303 to LED end strip cap 300. This attachment allows the hook to rotate three hundred and sixty degrees relative to LED light strip 201 so the utility light 200 can be directionally positioned to illuminate a work area when suspended by hook 301. An alternative hook arrangement could be a ball joint type connection between LED strip end cap 300 and hook 301.

Flexible LED light strip 201 is inserted into and attached to magnet bracket 304. This attachment may be either fixed or allow for sliding adjustment of magnet bracket 304 along the length of flexible light strip 201. Magnet 305 is attached to magnet bracket 304 by magnet screw 306.

End B 205 of flexible LED light strip 201 is inserted into and attached to LED strip compression coupler 307. End X 308 of electric cable 209 is routed through Led Strip coupler compression cap 309 and LED strip compression coupler 307 and conductively connected to flexible LED light strip 201. End X 308 of electric cable 209 is secured in place by tightening LED strip Coupler cap 309 onto LED strip compression coupler 307.

End Y 310 of electric cable 209 is routed through handle coupler compression cap 311, handle compression coupler 312, gasket 313, and conductively connected to circuit board 314. End Y 310 of electric cable 209 is secured in place by tightening handle coupler cap 311 onto handle compression coupler 312.

Circuit board 314 is attached to inside bracket 1 315 by circuit board screws 316. Mounted on circuit board 314 are light on/off button 317, light function button 318, red LED 319, green LED 1 320 and green LED 2 321. USB port 322 is mounted on USB circuit board 323. USB circuit board 323 is attached to inside bracket 1 315 with USB circuit board screws 324 and conductively connected to circuit board 314. Rechargeable battery 325 is conductively connected to circuit board 314 with battery cable 326 and battery cable quick connector 327. Inside bracket 1 315 and inside bracket 2 328 fit together to incase rechargeable battery 325 and the various electrical cables and connections to circuit board 314.

Handle cover 329, on/off button cover 330, light function button cover 331, and function indicator light cover 332 are made of a moisture and/or chemical resistant material such as silicone. Function indicator light cover 332 is also opaque or clear to allow the colors of red LED 319, green LED 1 320 or green LED 2 321 to illuminate function indicator light cover 332. On/off button cover 330, light function button cover 331, and function indicator light cover 332 are mounted on handle cover 329 to form a moisture and chemical resistant seal and aligned to fit respectively over light on/off button 317; light function button 318; and red LED 319, green LED 1 320, and green LED 2 321, when handle cover 329 is slipped over fitted together inside bracket 1 315 and inside bracket 2 328. Handle compression coupler 312 is attached to handle cover 329 by handle compression coupler screws 333. USB cover 334 is attached to handle cover 329 by USB cover screws 335. Storage loop 336 is attached to handle cover 329 by storage loop screws 337.

FIG. 4 is a cross section at line 4-4 of FIG. 2 of flexible LED light strip 201 and magnet assembly 206. The light source of flexible LED light strip 201 is a flexible printed circuit board (FPCB) 400 which has at least one LED 401 mounted thereon. Other standard electrical components (not pictured), such as resistors, may also mounted on flexible printed circuit board (FPCB) 400. These components are typically mounted on flexible printed circuit board (FPCB) 400 with a solder connection. At least one positive wire lead 402 and at least one negative wire lead 403 associated with flexible printed circuit board (FPCB) 400 provide the required low DC current to these components to illuminate LED 401. Typically the flexible printed circuit board (FPCB) 400 and components are wired in parallel.

Flexible printed circuit board (FPCB) 400 and its associated components are encased in one or more layers of material to provide various characteristics or properties to flexible light strip 201. These characteristics or properties include water resistance or water proofing, light blockage, light reflection, light transmission, light diffusion, flexibility, and impact damage resistance. The layer material may include silicone, epoxides, other suitable polymeric materials, and combinations thereof. Illustrated in this embodiment of flexible LED light strip 201 are waterproof-light conducting silicone layer 404, light conducting silicone layer 405, light diffusing silicone layer 406, and anti-light leakage silicone layer 407. The three outer surfaces of anti-light leakage silicone layer 407 form non-illuminated surfaces 202, and the generally semi-circular surface of light conducting silicone layer 405 forms illuminated surface 203. LED light strip is resistant to failure that may be caused by bending and twisting. To increase the flexibility and durability of LED light strip 201, the flexible printed circuit board (FPCB) 400 is oriented within flexible LED light strip 201 at an angle which minimizes the stress on flexible printed circuit board (FPCB) 400 to tearing, short circuiting, or disconnection of the SMDs attached to flexible printed circuit board (FPCB) 400, when LED light strip 201 is flexed or twisted. In this illustrated embodiment, the SMD mounting surface of printed circuit board (FPCB) 400 is oriented approximately zero degrees to the direction of light emission of the LED light strip 201. In the prior art LED rope lights and LED linear light configurations the SMD mounting surface of the printed circuit board (FPCB) oriented approximately ninety degrees to the direction of light emission. Increased flexibility and durability of LED light strip 201 may also be obtained by using stronger solder joints to attach the SMDs to SMD mounting surface of printed circuit board (FPCB) 400. This can be achieved by using thicker solder joints and/or more malleable solder material.

Attached to flexible LED light strip 201 is magnet assembly 206 to enable removable attachment of the light to metallic surfaces. Magnet assembly 206 is attached to flexible LED light strip 201 by magnet bracket 304. Magnet 305 is attached to magnet bracket 304 by magnet screw 306.

The illustrated embodiment generally operates as follows. Circuit board 314 contains the circuits for: turning utility light 200 on and off; regulating current flow from rechargeable battery 325 to flexible printed circuit board (FPCB) 400; switching light strip 200 functions, and corresponding current requirements, between levels of light brightness and light blinking; regulating current flow to rechargeable battery 325 from a power source coming into USB port 322; and illuminating red LED 319, green LED 1 320, and green LED 2 321 to indicate the appropriate operational status of utility light 200. The operational and illumination sequences are: when utility light 200 is off and not charging, red LED 319, green LED 1 320, and green LED 2 321 are not illuminated; when utility light 200 is on and not plugged into a USB charger for charging, red LED 319 and green LED 1 320 are not illuminated, and green LED 2 321 is illuminated; when utility light 200 is off and plugged into a USB charger and rechargeable battery 325 is charging, red LED 319 is illuminated and green LED 1 320 and green LED 2 321 are not illuminated; when utility light 200 is off and plugged into a USB charger and rechargeable battery 325 is fully charged, red LED 319 and green LED 2 321 are not illuminated, and green LED 1 320 is illuminated.

It will be apparent to those skilled in the pertinent arts that other embodiments of utility, work or inspection lights in accordance with the invention can be designed, and that the principles of utility, work or inspection lights in accordance with the invention are not limited to the specific embodiment described herein. Accordingly, modifications and other variations of the above-described illustrative embodiments of the invention may be effected without departing from the spirit and scope of the novel concepts of the invention.

The invention claimed is:

1. A lighting device comprising:
   a) a power source;
   b) a control module that receives power from the power source; and
   c) a flexible LED light that receives power from and is operated by the control module, wherein a light source of the flexible LED light is at least one flexible printed circuit board that contains at least one light emitting diode, and wherein the light source is fully coated and encased in a first layer of material that provides the characteristics of water proofing and light reflection, and the first layer is partially or fully encased in a second or more layers of material that provide one or more characteristics selected from the group water resistance, water proofing, light blockage, and damage resistance, or combinations thereof.

2. A device as claimed in claim 1 wherein the power source is a battery that is recharged through a USB port.

3. A device as claimed in claim 1 wherein the power source is a battery that is recharged through a USB port and a recharging regulation circuit.

4. A lighting device comprising:
   a) a power source;
   b) a control module that receives power from the power source and contains at least one circuit for regulating power output;
   c) a flexible LED light that receives power from and is operated by the control module, wherein a light source of the flexible LED light is at least one flexible printed circuit board that contains at least one light emitting diode;
   d) a first layer that fully encases the light source, and that provides the characteristics of water proofing and light transmission;
   e) a second layer that fully encases the first layer, and that provides the characteristic of light transmission;
   f) a third layer that partially encases the second layer, and that provides the characteristic of light diffusion; and g) a fourth layer that partially encases the third layer, and that provides the characteristic of light blockage.

5. A device as claimed in claim 4 wherein the control module contains circuits for controlling one or more functions of the flexible LED light selected from the group light on and off, levels of light brightness, light blinking, and light color.

6. A device as claimed in claim 4 further comprising one or more attachment devices to position the device to illuminate a task or work area selected from the group hook, and magnet.

7. A device as claimed in claim 4 further comprising a wired or wireless camera integral with, or added to, or associated with the device to observe a task or work area.

8. A device as claimed in claim 4 wherein the first layer, the second layer, the third layer, and the fourth layer are flexible and, either alone or in combination, provide the characteristic of impact damage resistance.

9. A device as claimed in claim 4 wherein the material for the first layer, the second layer, the third layer, and the fourth layer may be selected from silicone, epoxies, and other suitable polymeric materials, or combinations thereof.

10. A device as claimed in claim 4 wherein the material for the first layer, the second layer, the third layer, and the fourth layer are a silicone.

\* \* \* \* \*